United States Patent [19]

Liu

[11] Patent Number: 5,804,455

[45] Date of Patent: Sep. 8, 1998

[54] REDUCED PRIMARY CRYSTALLINE DEFECT DAMAGE IN NMOSFETS WITH AN OPTIMIZED LDD STRUCTURE

[75] Inventor: Ming-Hsi Liu, Taipei, Taiwan

[73] Assignee: Winbond Electronics Corporation, Hsinchu, Taiwan

[21] Appl. No.: 625,874

[22] Filed: Apr. 1, 1996

[51] Int. Cl.$^6$ .................................................. H01L 21/336
[52] U.S. Cl. ................................................ 437/44; 437/41
[58] Field of Search ............................ 437/44, 41 RLD, 437/41 CS, 27

[56] References Cited

U.S. PATENT DOCUMENTS

| | | | |
|---|---|---|---|
| 4,994,404 | 2/1991 | Sheng et al. | 437/27 |
| 5,145,797 | 9/1992 | Nakanishi | 437/43 |
| 5,200,352 | 4/1993 | Pfiester | 437/41 RLD |
| 5,374,574 | 12/1994 | Kwon | 437/41 CS |
| 5,384,268 | 1/1995 | Lur et al. | 437/20 |
| 5,436,176 | 7/1995 | Shimizu et al. | 437/27 |
| 5,571,737 | 11/1996 | Sheu et al. | 437/44 |

FOREIGN PATENT DOCUMENTS 3198350  8/1991  Japan ........................................ 437/27

OTHER PUBLICATIONS

S. Wolf, R.N. Tauber, *Silicon Processing for the VLSI Era*, Lattice Press, pp. 295–308, 1996.

*Primary Examiner*—Trung Dang
*Assistant Examiner*—Toniae M. Thomas
*Attorney, Agent, or Firm*—Meltzer, Linne, Goldstein, et al.

[57] ABSTRACT

A method for forming a MOSFET device, having Lightly Doped Drain structures with reduced primary crystalline defect damage wherein a semiconductor structure is provided having a thin silicon oxide layer on a silicon substrate, a polysilicon layer formed on the silicon oxide layer, and a photoresist mask formed on the polysilicon layer. The mask is patterned to form two narrow slit openings through which the polysilicon layer is exposed. The exposed polysilicon is anisotropically etched to define a gate region between the two slits. A first ion implantation forms two lightly doped regions in the substrate on either side of the gate region. The ion implantation takes place through the slits so that the implanted regions in the substrate are narrow. This limits the region of the substrate in which there is primary crystalline defect damage. The first photoresist mask layer is removed. A second photoresist mask layer is formed on all exposed surface areas and patterned so that only the polysilicon gate region is covered. The exposed polysilicon is anisotropically etched and the remaining mask layer is removed. A layer of silicon oxide is deposited on all exposed surface areas. Anisotropic etching is used on the silicon oxide until the substrate not under the polysilicon layer is exposed. Thus, residues of silicon oxide remain on the vertical edges of the gate region to act as spacers. A second ion implantation is performed on both sides of the gate region to form heavily doped regions.

2 Claims, 7 Drawing Sheets

REDUCED PRIMARY CRYSTALLINE DEFECT DAMAGE IN NMOSFETS WITH AN OPTIMIZED LDD STRUCTURE

FIELD OF THE INVENTION

The present invention relates to semiconductor IC manufacture. In particular, the present invention relates to a method for forming a MOSFET with an LDD (Lightly Doped Drain) structure with reduced primary crystalline defect damage.

BACKGROUND OF THE INVENTION

Ion implantation is a technique that has been widely used in VLSI processing. Ion implantation has many advantages for VLSI processing, the most important being the ability to control the number of impurity atoms introduced into a silicon substrate more precisely. The price for such benefits is high, because ion implantation cannot be performed without damage to the silicon substrate. When energetic ions enter a silicon substrate, they lose their energy in a series of nuclear and electron collisions and finally come to rest. The electron-energy loss can be accounted for in terms of electronic excitations to higher energy levels or in the generation of electron-hole pairs. However, electron collisions do not displace silicon atoms from their lattice positions. Only nuclear collisions can transfer sufficient energy to the lattice so that host atoms are displaced resulting in lattice disorder. The lattice in these disordered regions exhibits several different damage configurations:

(a) isolated point defects or point defect clusters in essentially crystalline silicon (the type of damage that results from implanting light ions, or when En~2Edi; where En is the energy transferred to a silicon atom and Edi is the energy required to displace silicon atom from its lattice site)

(b) local zones of completely amorphous material in an otherwise crystalline layer (An amorphous region is defined as a region in which the displaced atoms per unit volume approach the atomic density of the semiconductor). This form of damage configuration is associated with low dose implants of heavy ions (En>>Edi); and (c) continuous amorphous layers which form as the damage from the ions accumulates. That is, as the dose of ions (typically heavy ions) increase, the locally amorphous regions eventually overlap, and a continuous amorphous layer is formed.

It is an established fact that types (a) and (b) are grouped into the category of primary crystalline defect damage. Type (c) will be referred to as amorphous layer damage since the damage annealing procedure for type (a) and (b) are the same, but a different damage annealing procedure is employed for type (c).

A typical process for the formation of NMOSFET's with a conventional LDD structure is shown in FIGS. 1A through 1G.

Shown in FIG. 1A, a semiconductor structure 10 is provided having a thin silicon oxide layer 14 (gate dielectric) on a silicon substrate 12. A polysilicon layer 16 is formed on the thin silicon oxide layer 14. Illustratively, the substrate 12 is P-type.

Shown in FIG. 1B, a first photoresist mask layer 18 is formed on the polysilicon layer 16 and patterned. Only a gate region 20 of the polysilicon layer 16 is covered by the remaining first photoresist mask layer 18.

Shown in FIG. 1C, an anisotropic etching is performed. The exposed polysilicon is anisotropically etched so that only the gate region 20 remains.

Shown in FIG. 1D, the first photoresist mask layer 18 is removed. A first ion implantation 21 is performed and wide N-regions 22 and 24 with primary crystalline defect damage are formed on either side of the gate region 20.

Shown in FIG. 1E, a layer of undoped silicon oxide 26 is deposited on all exposed surface areas.

Shown in FIG. 1F, an anisotropic etching is used first on the undoped silicon oxide 26 and then the gate oxide 14 until the silicon substrate that is not under cover of polysilicon gate region 20 is exposed, such that residues of undoped silicon oxide remain on the vertical edges of the polysilicon gate region 20 to act as spacers 30.

Shown in FIG. 1G, a second ion implantation 32 is performed to form heavily doped regions 34, 36 that act as source/drain regions.

The result of this process is an NMOSFET 10 shown in FIG. 1G comprising a P-substrate 12, a gate structure comprising gate oxide 14, polysilicon gate 20, and spacers 30, and LDD type source/drain regions. Each source/drain region comprises a lightly doped N-type region 22 or 24 and a heavily doped N-type region 34 or 36.

The following prior art references relate to the formation of the LDD structure.

Stanly Wolf "Silicon Process for The VLSI ERA", Lattice Press, Sunset Beach, Calif., 1986

U.S. Patent Documents

U.S. Pat. No. 5,436,176

U.S. Pat. No. 5,384,268

U.S. Pat. No. 5,145,797

A problem with the prior art process used to form the LDD structure is that the lightly doped regions 22, 24 occupy a relatively large region of the substrate. As these regions are formed by low dose implants of heavy ions, there is significant primary crystalline defect damage in these regions of the substrate.

Accordingly, it is an object of the invention to provide an alternate process for making a MOSFET device such as an NMOSFET with LDD source/drain regions in which the primary crystalline damage is confined to a smaller region of the substrate.

SUMMARY OF THE INVENTION

A method for forming a MOSFET device, such as an NMOSFET, with a Lightly Doped Drain (LDD) structure with reduced primary crystalline defect damage is disclosed. A semiconductor structure is provided having a thin silicon oxide layer (gate dielectric) on a silicon substrate. A polysilicon layer is formed on the thin silicon oxide layer. A photoresist mask is formed on the polysilicon layer. The photoresist mask is patterned to form two narrow slit openings through which the polysilicon layer is exposed. The exposed polysilicon is anisotropically etched. This defines a gate region between the two narrow slit openings. A first ion implantation now takes place to form two lightly doped regions in the substrate on either side of the gate region. The ion implantation takes place only through the slits so that the implanted regions in the substrate are also narrow. This significantly limits the region of the substrate in which there is primary crystalline defect damage and is a significant advantage of the invention. Then, the first photoresist mask layer is removed. A second photoresist mask is formed on all exposed surface areas and patterned so that only the gate region of the polysilicon layer is covered by the second photoresist mask. The exposed portions of the polysilicon layer are anisotropically etched and the remaining second photoresist mask layer is removed. A layer of undoped silicon oxide is deposited on all exposed surface areas. Anisotropic etching is used first on the undoped silicon oxide until the silicon substrate that is not under the polysilicon layer is exposed, such that residues of undoped silicon oxide remain on the vertical edges of the polysilicon gate region to act as spacers. A second ion implantation is then performed on both sides of the gate region to form heavily doped regions that act as source/drain regions.

DETAILED DESCRIPTION OF THE INVENTION

Figure 2:
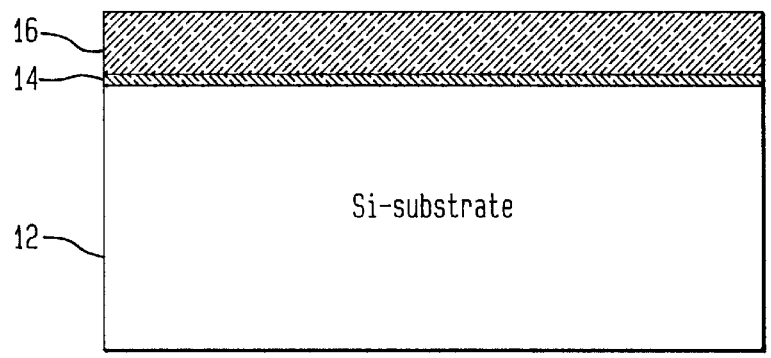
FIGS. 2 through 11 illustrate the inventive method of manufacturing an NMOSFET so that the primary crystalline defect damage will be effectively reduced.

Referring now to FIG. 2, in accordance with one embodiment of the invention, a P-type silicon substrate 12 is covered by a thin silicon oxide layer 14 (gate oxide). The thin silicon oxide layer ranges in thickness from 70 to 300 Angstroms, and functions as the gate dielectric. Other materials may also be used for the gate dielectric. Illustratively, the gate dielectric may be formed by thermal oxidation or chemical vapor deposition (CVD).

A layer of polysilicon 16 is deposited on the thin silicon oxide layer 14 by chemical vapor deposition (CVD). The polysilicon layer 16 ranges in thickness from 1500 to 5000 angstroms. The polysilicon layer is then doped with phosphorous oxychloride ($POCl_3$) in a temperature range of about 800° to 1000° C. to reduce the resistance of the polysilicon. Illustratively, the polysilicon layer is doped to an impurity concentration of about 1E19 to 1E21/cm**3.

Figure 3:
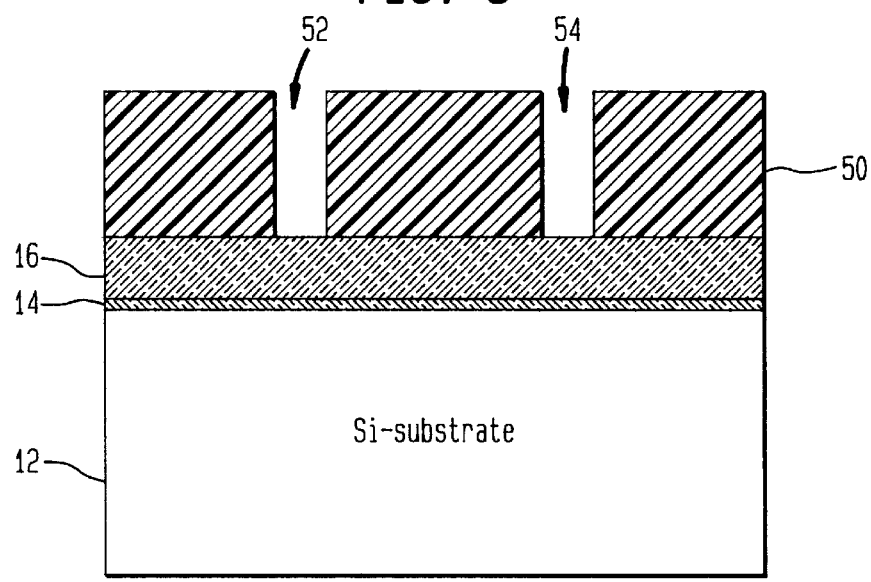

In FIG. 3, a first photoresist mask layer 50 is formed on the polysilicon layer 16. The photoresist mask layer has narrow slit openings 52,54.

Figure 4:
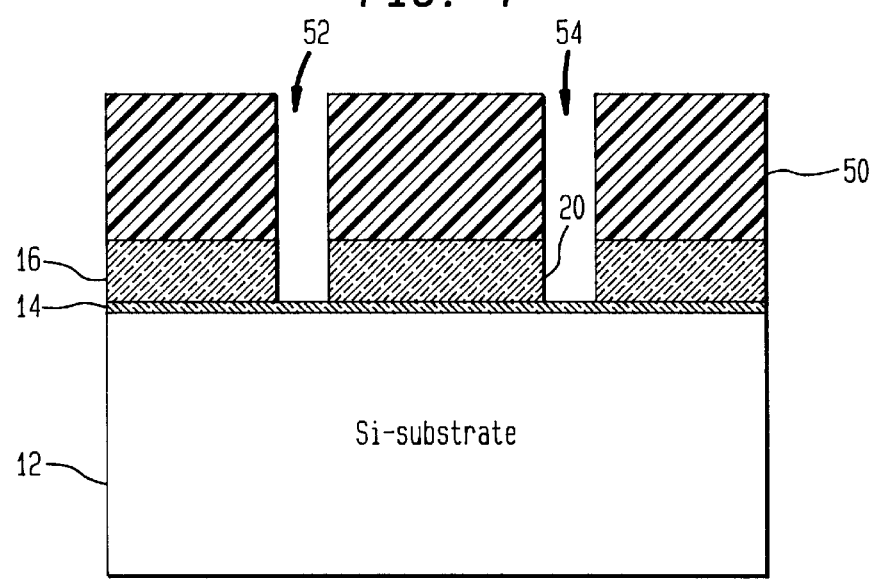

In FIG. 4, the uncovered regions of the polysilicon layer 16 are etched away. Anisotropic etching is utilized with an etching gas of high selectivity such as hydrogen bromide ($HBr/Cl_2/O_2$). That is, the etching rate is very high for silicon but very low for silicon oxide. As a result, the thin silicon oxide layer 14 acts as an etching stop that protects the silicon substrate from damage during the polysilicon etching process. A gate region 20 is defined in the polysilicon layer 16 between the slit openings 52, 54. Illustratively, the gate electrode region 20 has a width of approximately 0.25 to 0.80 microns and the slit openings 52, 54 have a width of approximately 0.1 to 0.4 microns.

Figure 5:
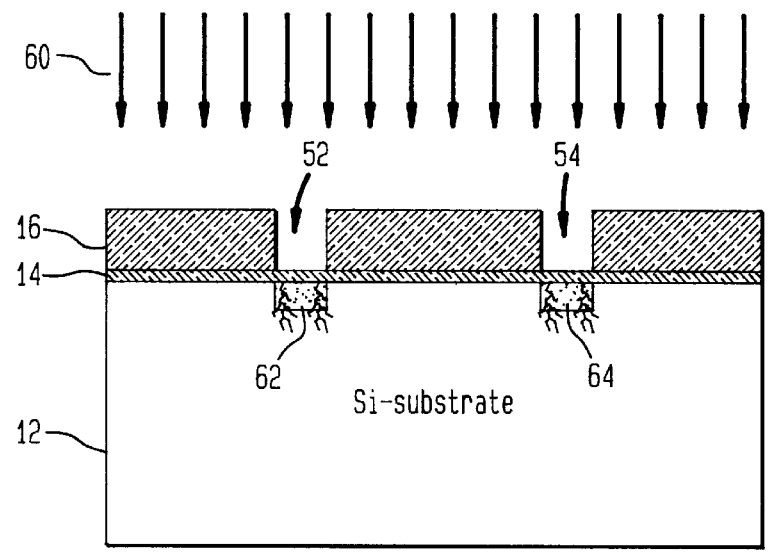

In FIG. 5, the photoresist mask 50 is removed. A first ion implantation 60 is performed to implant N-regions 62, 64 in the silicon substrate below the exposed portions of the thin silicon oxide layer 14. Illustratively, phosphorous ions may be used with an energy of about 5 to 70 kev and a dosage of about 1E13 to 6E13/cm2. The N-regions 62, 64 illustratively have a depth of approximately 0.05 to 0.5 microns and a doping concentration of about 1E17 to 1E19/cm3. The first ion implantation takes place through the narrow slit openings. Thus, the lightly doped regions 62, 64 have approximately the same widths as the slits, i.e., 0.1 to 0.4 microns. Thus, the region of the substrate which has primary crystalline defect damage is much smaller than when the above-described conventional NMOSFET formation process is used.

Figure 6:
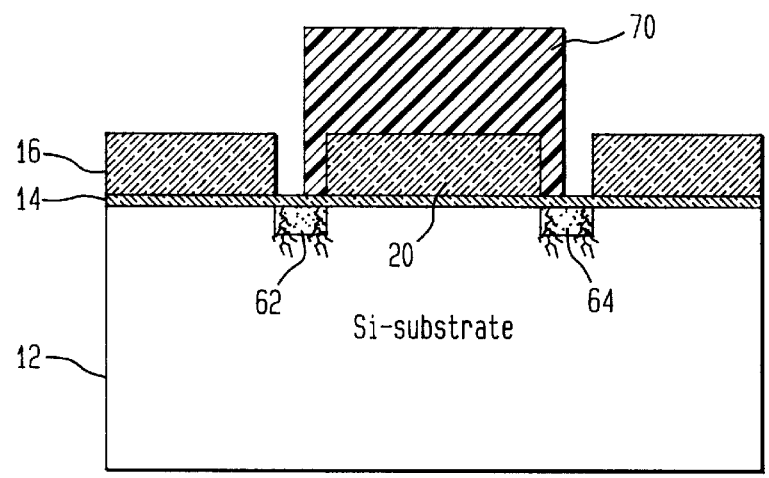

In FIG. 6, a second photoresist mask layer 70 is formed and patterned, only the gate region 20 is covered by the remaining photoresist mask layer 70.

Figure 7:
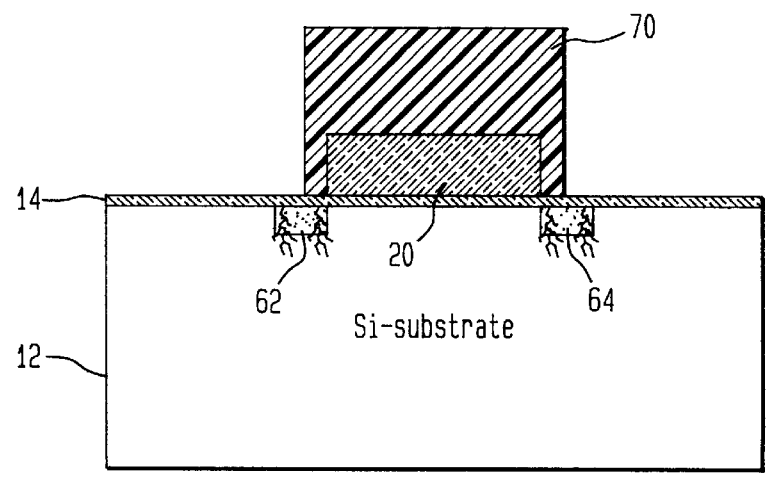

In FIG. 7, the exposed portions of the polysilicon layer 16 are etched away. Anisotropic etching is introduced with an etching gas of high selectivity such as hydrogen bromide ($HBr/Cl_2/O_2$). That is, the etching rate is very high for silicon but very low for silicon oxide. As a result, the thin silicon oxide layer 14 acts as an etching stop that protects the silicon substrate from damage during the polysilicon etching process.

Figure 8:
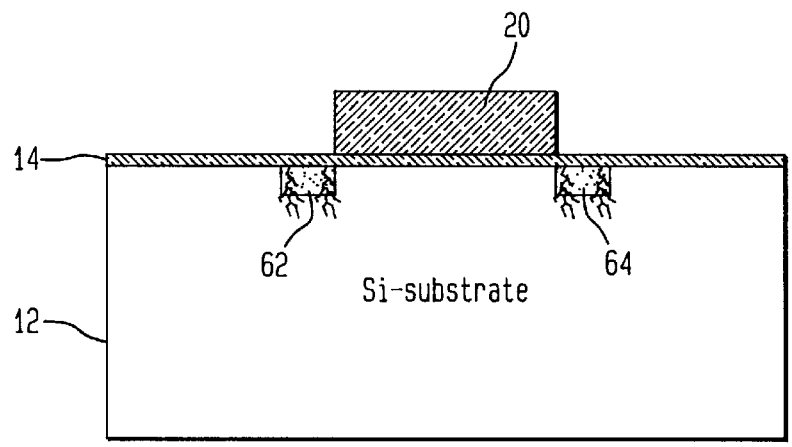

In FIG. 8, photoresist mask is removed.

Figure 9:
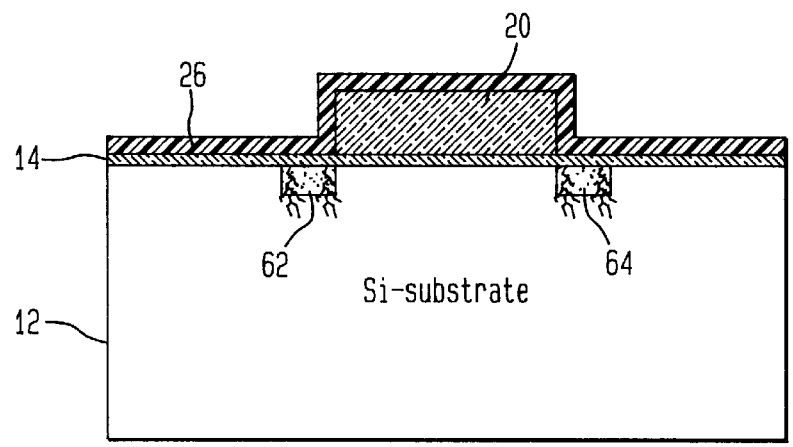

In FIG. 9, a layer of undoped silicon oxide 26 is deposited on all exposed surface areas to a thickness in the range of about 800 to 3000 angstroms by chemical vapor deposition (CVD). Illustratively, the reacting gas may be $SiH_2Cl_2/N_2O$, $SiH_4/O_2$ or $TEOS/O_2$, at a temperature in the range of about 400° C. to 800° C.

Figure 10:
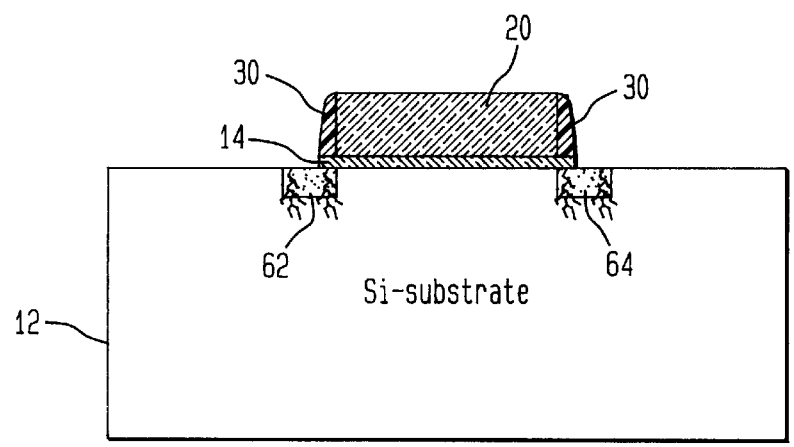

In FIG. 10, using an anisotropic etching process, the undoped silicon oxide layer 26 and the regions of the thin gate oxide 14 that are not covered by the polysilicon gate 20 are etched with a highly selective etching gas until the silicon substrate is exposed. In other words, the etching rate is very high for silicon oxide but very low for silicon. Illustratively, the etching gas may be $CHF_3/CF_4$. Because the etching depth can be controlled by this process, residual amounts of undoped silicon oxide are retained on the vertical edges of the polysilicon gate electrode region 20. These residual undoped silicon oxide regions act as spacers 30.

Figure 11:
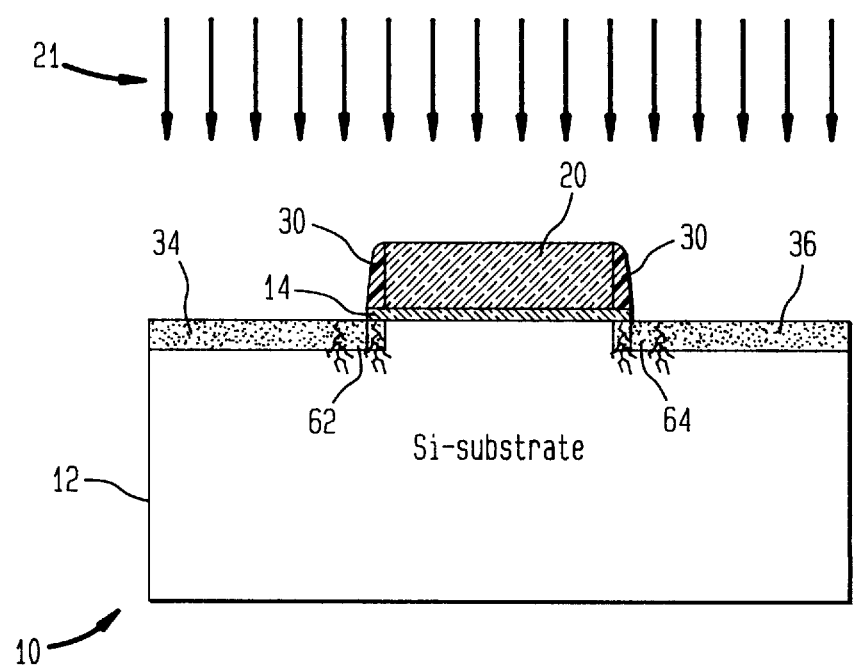

In FIG. 11, a second ion implantation 21 is performed to implant source/drain regions 34, 36 in the silicon substrate 12 beneath the exposed substrate areas. Illustratively, arsenic ions may be used with an energy of about 5 to 100 kev and a dosage of about 1E15 to 8E15/cm2. The source/drain regions 34, 36 illustratively have a depth of approximately 0.05 to 0.5 microns, a width of approximately 0.5 to 1.5 microns, and a doping concentration of about 1E20 to 1E21/cm3.

The advantage of the invention is significant. In this invention, the size of the lightly doped regions that are formed by the first ion implantation are reduced and the primary crystalline defect damage will be effectively reduced. The dopant concentration of source/drain regions that are formed by this new technique are almost the same with the dopant concentration of source/drain regions that are formed by the prior art technique since the dosage of the second ion implantation is about two orders of magnitude greater than the dosage of the first ion implantation.

Figure 1A:
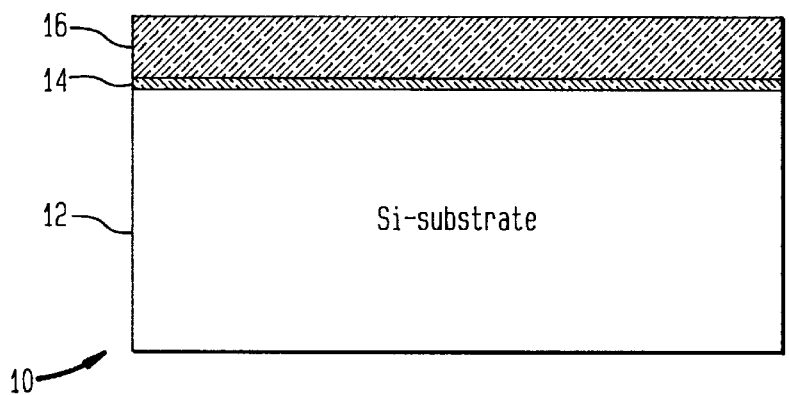
FIGS. 1A through 1G illustrate a prior art method of manufacturing an NMOSFET.
Figure 1B:
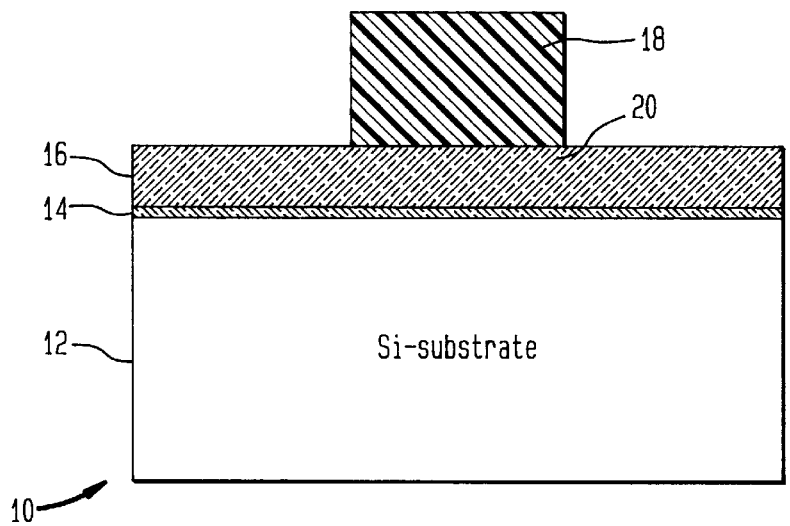
Figure 1C:
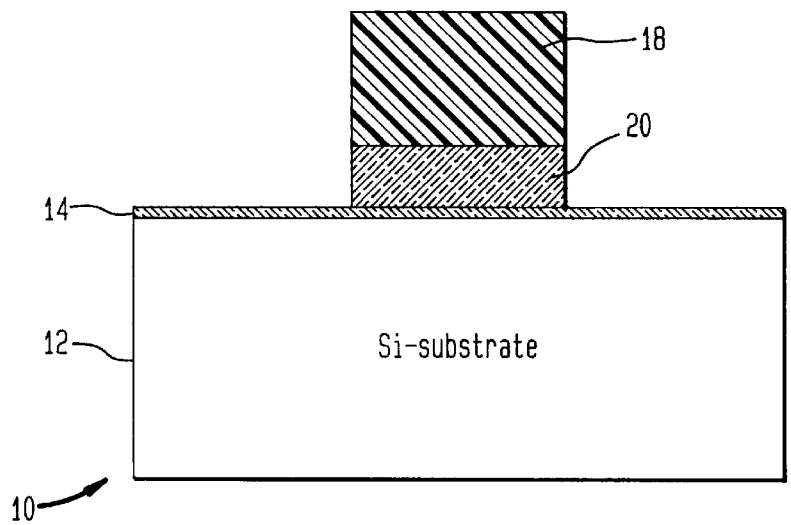
Figure 1D:
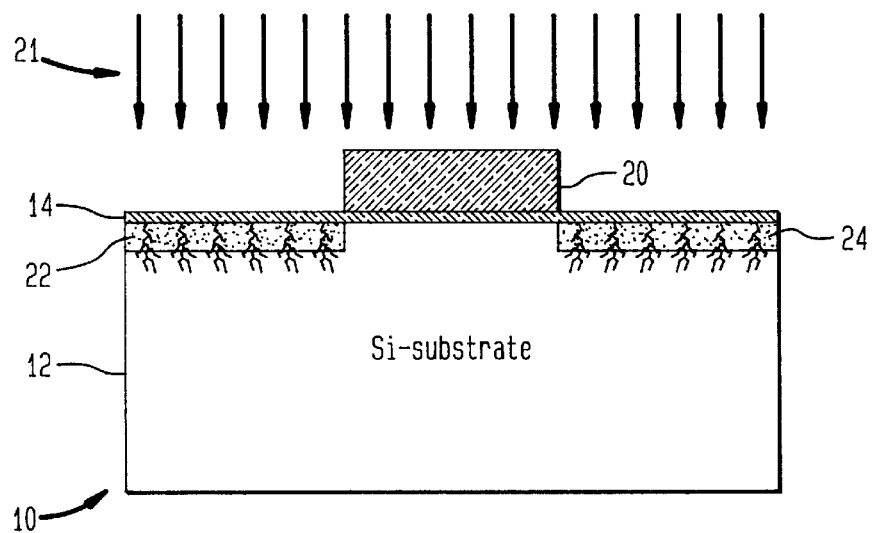
Figure 1E:
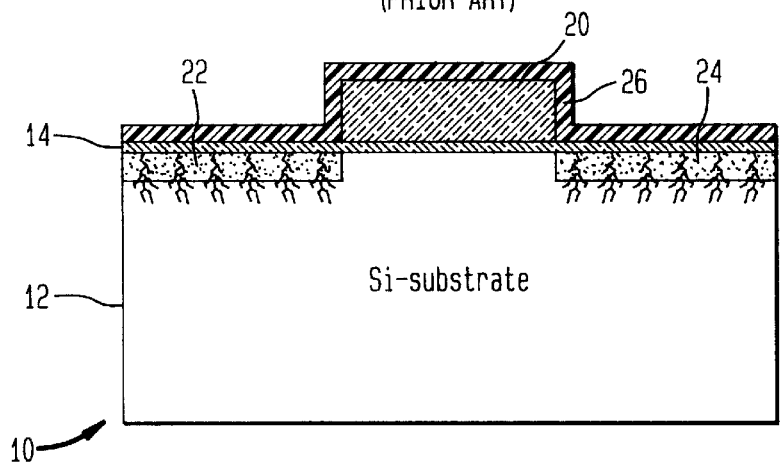
Figure 1F:
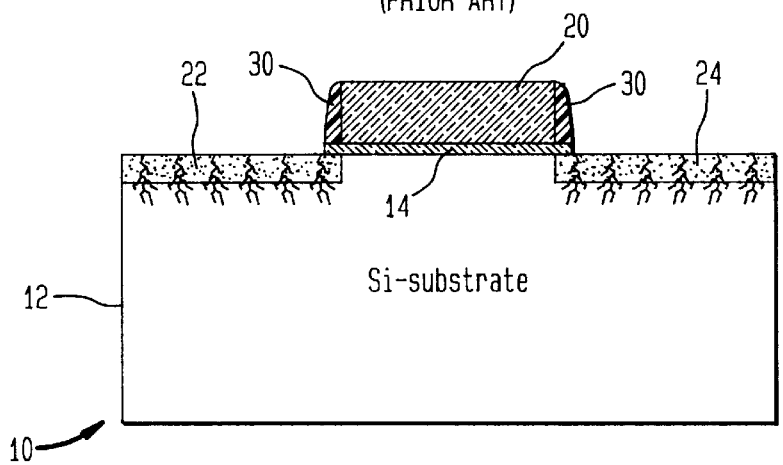
Figure 1G:
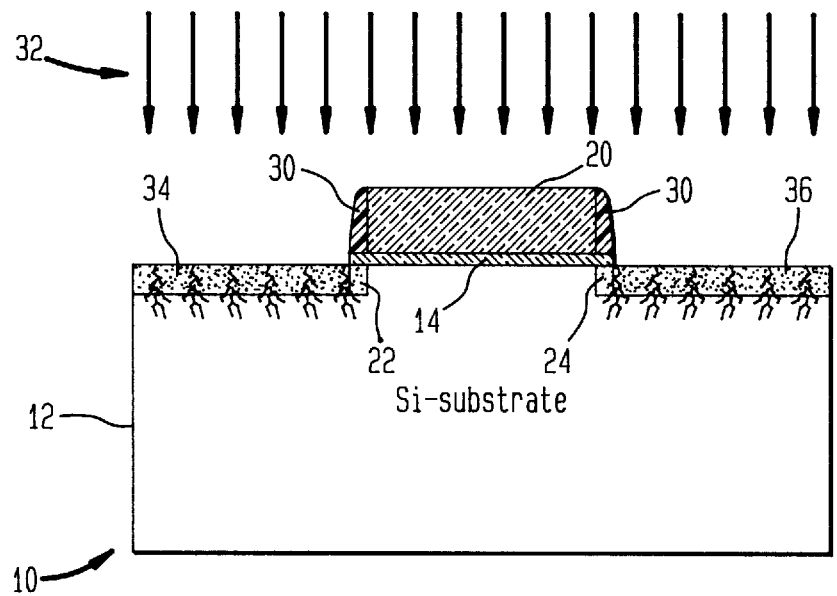

Thus, the final device structure shown in FIG. 11 is substantially the same as the device structure shown in FIG. 1G. It should be noted that the heavily doped regions 34, 36 may overlap at least in part the lightly doped regions 62, 64. Preferably, the heavily doped regions 62, 64 are continuous with the lightly doped regions 34, 36. The portions of the lightly doped regions 62, 64 under the spacers are generally not overlapped by the heavily doped regions 34, 36.

Finally, the above-described embodiments of the invention are intended to be illustratively only. Numerous alternative embodiments of the invention may be devised by those skilled in the art without departing from the spirit and scope of the following claims. In particular, the formation of an NMOSFET in a P-substrate has been disclosed. However, the NMOSFET can also be formed in a P-well formed in an N-substrate. In addition, the inventive method can also be used to form a PMOSFET in which case the conductivity type of each region is reversed.

I claim:

1. A method for forming a MOSFET with LDD type source and drain regions comprising the steps of:

(a) forming on a silicon substrate a gate dielectric layer and a polysilicon layer on the gate dielectric layer, (b) forming a first mask layer on said polysilicon layer, said first mask layer having two spaced apart narrow slit openings, the slits exposing portions of said polysilicon layer, (c) removing said exposed portions of said polysilicon layer to form two spaced apart narrow slit openings separated by a gate region in said polysilicon layer, (d) removing said first mask layer, (e) performing a first ion implantation into said substrate through said slit openings in said polysilicon layer to form two narrow spaced apart lightly doped regions in said substrate, so that primary crystalline defect damage resulting from the first implantation is confined to the narrow lightly doped regions, (f) forming a second mask layer which covers said gate region, (g) removing the remainder of said polysilicon layer not covered by said second mask layer, (h) forming dielectric spacers on the sidewalls of said gate region, and (i) performing a second ion implantation in the substrate to form heavily doped source/drain regions on either side of the gate region.

2. The method of claim 1 wherein said narrow lightly doped regions in said substrate have a width of 0.1 to 0.4 microns.

* * * * *